(12) United States Patent
Riker

(10) Patent No.: US 9,543,126 B2
(45) Date of Patent: Jan. 10, 2017

(54) COLLIMATOR FOR USE IN SUBSTRATE PROCESSING CHAMBERS

(71) Applicant: APPLIED MATERIALS, INC., Santa Clara, CA (US)

(72) Inventor: Martin Lee Riker, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/607,273

(22) Filed: Jan. 28, 2015

(65) Prior Publication Data

US 2016/0145735 A1    May 26, 2016

Related U.S. Application Data

(60) Provisional application No. 62/085,009, filed on Nov. 26, 2014.

(51) Int. Cl.
*C23C 14/34* (2006.01)
*H01J 37/34* (2006.01)
*C23C 14/04* (2006.01)

(52) U.S. Cl.
CPC ............ *H01J 37/34* (2013.01); *C23C 14/046* (2013.01); *H01J 37/3408* (2013.01); *H01J 37/3447* (2013.01)

(58) Field of Classification Search
CPC .... H01J 37/3441; H01J 37/3447; C23C 14/34

USPC .................................................. 204/298.11
See application file for complete search history.

(56) References Cited

U.S. PATENT DOCUMENTS

| | | | |
|---|---|---|---|
| 6,362,097 | B1 | 3/2002 | Demaray et al. |
| 2003/0029715 | A1 | 2/2003 | Yu et al. |
| 2004/0211665 | A1 | 10/2004 | Yoon et al. |
| 2006/0249369 | A1 | 11/2006 | Marangon et al. |
| 2009/0308372 | A1 | 12/2009 | Nordberg et al. |
| 2009/0308739 | A1 | 12/2009 | Riker et al. |

OTHER PUBLICATIONS

International Search Report and Written Opinion mailed Feb. 26, 2016 for PCT Application No. PCT/US2015/061826.

*Primary Examiner* — Rodney McDonald
(74) *Attorney, Agent, or Firm* — Moser Taboada; Alan Taboada

(57) ABSTRACT

Embodiments of collimators for use in substrate processing chambers are provided herein. In some embodiments, a collimator includes: a body having a central region, a peripheral region, and a transitional region disposed between the central and peripheral regions; a first plurality of apertures in the central region having a first aspect ratio; a second plurality of apertures in the peripheral region having a second aspect ratio less than the first aspect ratio; and a third plurality of apertures in the transitional region, wherein the third plurality of apertures are cut so the transitional region forms a conical shape surrounding the central region.

20 Claims, 3 Drawing Sheets

COLLIMATOR FOR USE IN SUBSTRATE PROCESSING CHAMBERS

CROSS-REFERENCE TO RELATED APPLICATIONS

This application claims benefit of U.S. provisional patent application Ser. No. 62/085,009, filed Nov. 26, 2014, which is herein incorporated by reference in its entirety.

FIELD

Embodiments of the present disclosure generally relate to substrate processing chambers used in semiconductor manufacturing systems.

BACKGROUND

Reliably producing submicron and smaller features is one of the key technological challenges for the next generation of very large scale integration (VLSI) and ultra large scale integration (ULSI) of semiconductor devices. However, as the miniaturization of circuit technology continues, the shrinking dimensions of interconnects in VLSI and ULSI technology have placed additional demands on the processing capabilities. For example, as circuit densities increase for next generation devices, the widths of interconnects, such as vias, trenches, contacts, gate structures and other features, as well as the dielectric materials therebetween, decrease while the thickness of the dielectric layers remains substantially constant, with the result of increasing the aspect ratios of the features.

Sputtering, also known as physical vapor deposition (PVD), is a commonly-used method of forming metallic features in integrated circuits. Sputtering deposits a material layer on a substrate. A source material, such as a target, is bombarded by ions strongly accelerated by an electric field. The bombardment ejects material from the target, and the material then deposits on the substrate. During deposition, ejected particles may travel in varying directions, rather than generally orthogonal to the substrate surface, thus resulting in overhanging structures formed on corners of high aspect ratio features in the substrate. Overhang may undesirably result in holes or voids formed within the deposited material, resulting in diminished electrical conductivity of the formed feature. Higher aspect ratio geometries have a higher degree of difficulty to fill without voids.

Controlling the ion fraction or ion density reaching the substrate surface to a particular range may improve the bottom and sidewall coverage during the metal layer deposition process (and reduce the overhang problem). In one example, the particles dislodged from the target may controlled via a process tool such as a collimator to facilitate providing a more vertical trajectory of particles into the feature. The collimator provides relatively long, straight, and narrow passageways between the target and the substrate to filter out non-vertically travelling particles which impact and stick to the passageways of the collimator.

The actual amount of filtering accomplished by a given collimator depends at least in part on the aspect ratio of the apertures through the collimator. As such, particles traveling on a path approaching normal to the substrate pass through the collimator and are deposited on the substrate, which improves coverage of the bottom of high aspect ratio features. However, certain problems exist with the use of prior art collimators, which typically have an overall hexagonal shape. Unfortunately, PVD chambers with a prior art collimator leave a six-point deposition near an edge of the substrate due to shadowing of the corners of the hexagonal collimator.

Thus, the inventors have provided improved embodiments of apparatus with improved deposition uniformity.

SUMMARY

Embodiments of collimators for use in substrate processing chambers are provided herein. In some embodiments, a collimator includes a body having a central region, a peripheral region, and a transitional region disposed between the central and peripheral regions; a first plurality of apertures in the central region having a first aspect ratio; a second plurality of apertures in the peripheral region having a second aspect ratio less than the first aspect ratio; and a third plurality of apertures in the transitional region, wherein the third plurality of apertures are cut so the transitional region forms a conical shape surrounding the central region.

In some embodiments, a collimator for use in a substrate processing chamber includes a body having a central region, a peripheral region, and a transitional region disposed between the central and peripheral regions; a first plurality of apertures in the central region having a first aspect ratio; a second plurality of apertures in the peripheral region having a second aspect ratio less than the first aspect ratio; and a third plurality of apertures in the transitional region, wherein the third plurality of apertures are cut so the transitional region forms a conical shape surrounding the central region wherein the first plurality of apertures, the second plurality of apertures, and the third plurality of apertures are textured, and wherein upper portions of the first plurality of apertures, the second plurality of apertures, and the third plurality include a chamfer.

In some embodiments, a process chamber includes a chamber body defining an inner volume; a sputtering target disposed in an upper portion of the inner volume; a substrate support disposed below the sputtering target; and a collimator disposed in the inner volume between the sputtering target and the substrate support, wherein the collimator includes a body having a central region, a peripheral region, and a transitional region disposed between the central and peripheral regions; a first plurality of apertures in the central region having a first aspect ratio; a second plurality of apertures in the peripheral region having a second aspect ratio less than the first aspect ratio; and a third plurality of apertures in the transitional region, wherein the third plurality of apertures are cut so the transitional region forms a conical shape surrounding the central region.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
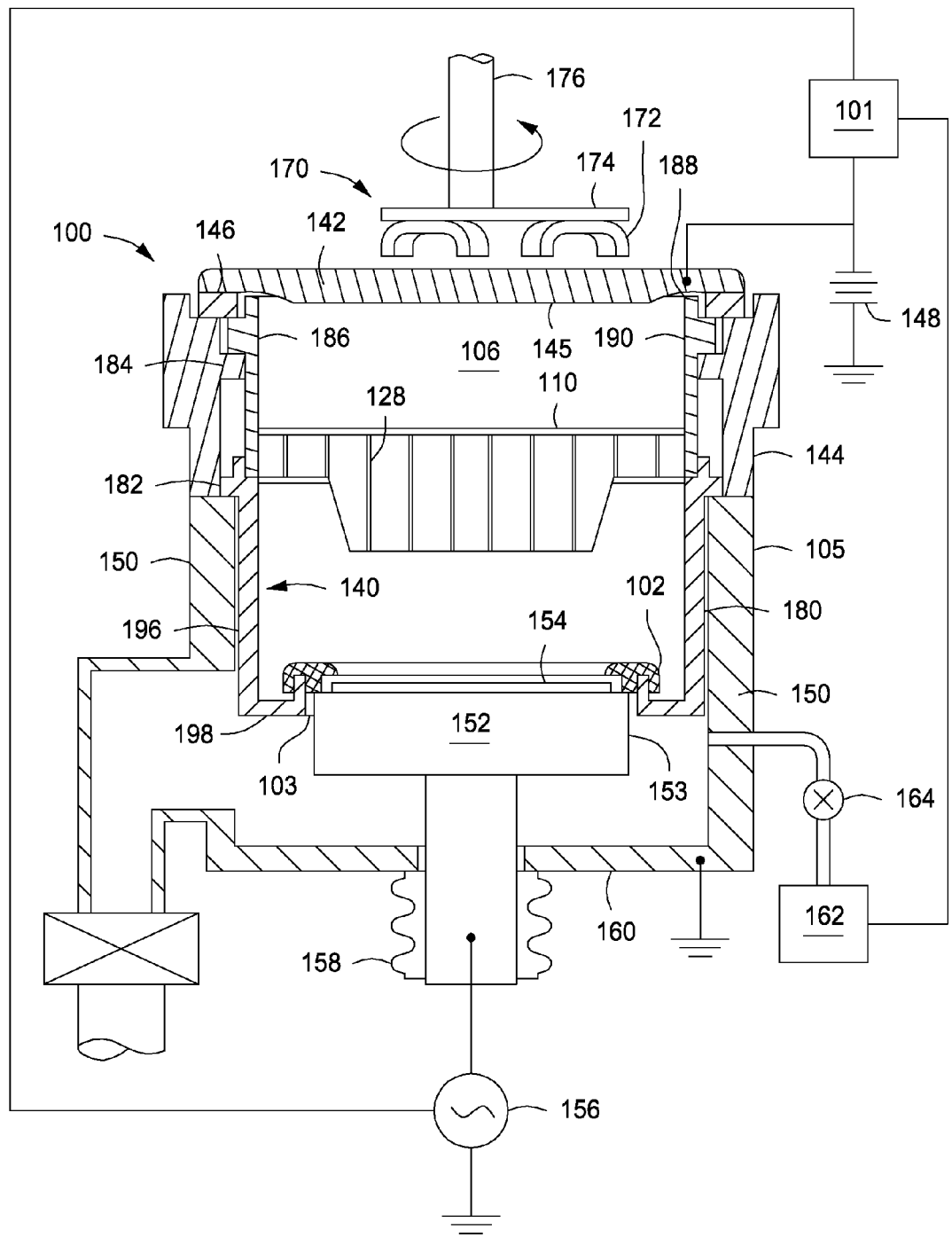
FIG. 1 depicts a simplified schematic cross-sectional side view of a process chamber in accordance with the some embodiments of the present disclosure.

To facilitate understanding, identical reference numerals have been used, where possible, to designate identical elements which are common to the figures. The figures are not drawn to scale and may be simplified for clarity. Elements and features of some embodiments may be beneficially incorporated in other embodiments without further recitation.

DETAILED DESCRIPTION

Embodiments of collimators, such as those used for microelectronic device fabrication of semiconductor substrates, are provided herein. Collimators as disclosed herein advantageously improve deposition uniformity across a substrate to be processed.

Embodiments of the present disclosure are illustratively described herein with respect to a physical vapor deposition (PVD) chamber. However, the inventive collimator may generally be used in any substrate processing chamber to filter non-vertically traveling particles. FIG. 1 illustrates a processing chamber 100 (e.g., a PVD chamber) suitable for sputter depositing materials and having a collimator 110 disposed therein in accordance with embodiments of the present disclosure. Illustrative examples of suitable PVD chambers which may be adapted to benefit from the disclosure include the ALPS® Plus and SIP ENCORE® PVD processing chambers, both commercially available from Applied Materials, Inc., Santa Clara, of California. Other processing chambers available from Applied Materials, Inc., as well as from other manufactures, may also be adapted in accordance with the embodiments described herein.

The chamber 100 has a chamber body 105 defining an inner volume 106. The chamber body 105 includes a grounded chamber wall 150 and a grounded conductive adapter 144 disposed above the grounded chamber wall 150. In some embodiments, the processing chamber 100 includes a process kit 140 having a lower shield 180, an upper shield 186, and a collimator 110. The processing chamber 100 also includes a sputtering source, such as a target 142 having a sputtering surface 145, and a substrate support 152, for receiving a substrate 154 thereon, having a peripheral edge 153. The substrate support 152 may be disposed within the grounded chamber wall 150.

The target 142 is supported by the grounded conductive adapter 144 through a dielectric isolator 146. The target 142 comprises the material to be deposited on a surface of the substrate 154 during sputtering, and may include copper for depositing as a seed layer in high aspect ratio features formed in the substrate 154. As used herein, the term aspect ratio refers to the ratio of the height, length, or depth of an element to the width of the element. In some embodiments, the target 142 may also include a bonded composite of a metallic surface layer of sputterable material, such as copper, and a backing layer of a structural material, such as aluminum.

In some embodiments, the substrate support 152 supports a substrate 154 having high aspect ratio features to be sputter coated, the bottoms of which are in planar opposition to a principal surface of the target 142. The substrate support 152 has a planar substrate-receiving surface disposed generally parallel to the sputtering surface of the target 142. The substrate support 152 may be vertically movable through a bellows 158 connected to a bottom chamber wall 160 to allow the substrate 154 to be transferred onto the substrate support 152 through a load lock valve (not shown) in a lower portion of the processing chamber 100. The substrate support may then be raised to a deposition position as shown.

In some embodiments, processing gas may be supplied from a gas source 162 through a mass flow controller 164 into the lower portion of the processing chamber 100. A controllable direct current (DC) power source 148, coupled to the processing chamber 100, may be used to apply a negative voltage or bias to the target 142. A radio frequency (RF) power source 156 may be coupled to the substrate support 152 to induce a DC self-bias on the substrate 154. In some embodiments, the substrate support 152 may be grounded. In some embodiments, the substrate support 152 may alternatively be electrically floated.

In some embodiments, a magnetron 170 is positioned above the target 142. The magnetron 170 may include a plurality of magnets 172 supported by a base plate 174 connected to a shaft 176, which may be axially aligned with the central axis of the processing chamber 100 and the substrate 154. The magnets 172 produce a magnetic field within the processing chamber 100 near the front face of the target 142 to generate plasma so a significant flux of ions strike the target 142, causing sputter emission of target material. The magnets 172 may be rotated about the shaft 176 to increase uniformity of the magnetic field across the surface of the target 142.

In some embodiments, the processing chamber 100 may include a grounded lower shield 180 having a support flange 182 supported by and electrically coupled to the chamber wall 150. An upper shield 186 is supported by and electrically coupled to a flange 184 of the conductive adapter 144. The upper shield 186 and the lower shield 180 are electrically coupled as are the conductive adapter 144 and the chamber wall 150. In some embodiments, both the upper shield 186 and the lower shield 180 are comprised of stainless steel. In some embodiments, the processing chamber 100 may include a middle shield (not shown) coupled to the upper shield 186. In some embodiments, the upper shield 186 and lower shield 180 may be electrically floating within the processing chamber 100. In some embodiments, the upper shield 186 and lower shield 180 may alternatively be coupled to an electrical power source.

In some embodiments, the upper shield 186 may have an upper portion which closely fits an annular side recess of the target 142 with a narrow gap 188 between the upper shield 186 and the target 142, which is sufficiently narrow to prevent plasma from penetrating and sputter coating the dielectric isolator 146. The upper shield 186 may also include a downwardly projecting tip 190, which covers the interface between the lower shield 180 and the upper shield 186 to prevent bonding of the lower shield 180 and the upper shield 186 by sputter deposited material.

In some embodiments, the lower shield 180 may extend downwardly into a cylindrical outer band 196, which generally extends along the chamber wall 150 to below the top surface of the substrate support 152. The lower shield 180 may have a base plate 198 extending radially inward from the cylindrical outer band 196. The base plate 198 may include an upwardly extending cylindrical inner band 103 surrounding the perimeter of the substrate support 152. In some embodiments, a cover ring 102 rests on the top of the cylindrical inner band 103 when the substrate support 152 is in a lower, loading position and rests on the outer periphery of the substrate support 152 when the substrate support is in an upper, deposition position to protect the substrate support 152 from sputter deposition.

The lower shield 180 encircles the sputtering surface 145 of the target 142 facing the substrate support 152 and also encircles a peripheral wall of the substrate support 152. The lower shield 180 also covers and shadows the chamber wall 150 of the processing chamber 100 to reduce deposition of sputtered deposits originating from the sputtering surface 145 of the target 142 onto the components and surfaces behind the lower shield 180. For example, the lower shield 180 can protect the surfaces of the substrate support 152, portions of the substrate 154, the chamber wall 150, and the bottom wall 160 of the processing chamber 100.

Figure 3:
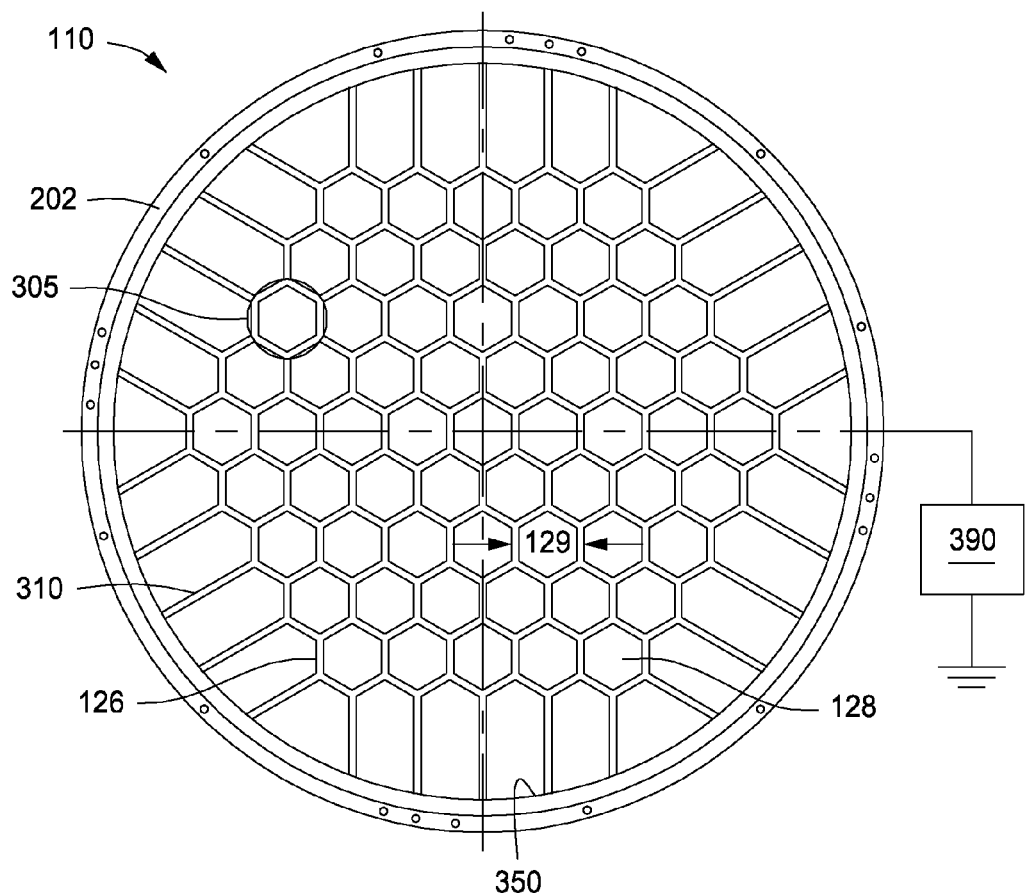
FIG. 3 depicts a top view of a collimator in accordance with some embodiments of the present disclosure.
Figure 4:
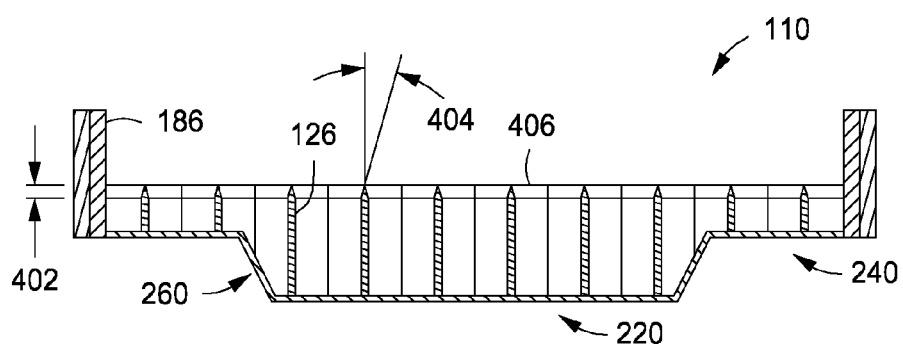
FIG. 4 depicts a cross-sectional side view of the collimator of FIG. 2.

In some embodiments, directional sputtering may be achieved by positioning the collimator 110 between the target 142 and the substrate support 152. The collimator 110 may be mechanically and electrically coupled to the upper shield 186. In some embodiments, the collimator 110 may be coupled to a middle shield (not shown), positioned lower in the processing chamber 100. In some embodiments, the collimator 110 may be integral to the upper shield 186. In some embodiments, the collimator 110 is welded to the upper shield 186. In some embodiments, the collimator 110 may be electrically floating within the processing chamber 100. In some embodiments, the collimator 110 may be coupled to an electrical power source. The collimator 110 includes a plurality of apertures 128 to direct gas and/or material flux within the chamber. In some embodiments, the apertures 128 may have a hexagonal shape, as illustrated in FIGS. 2-4.

Figure 2:
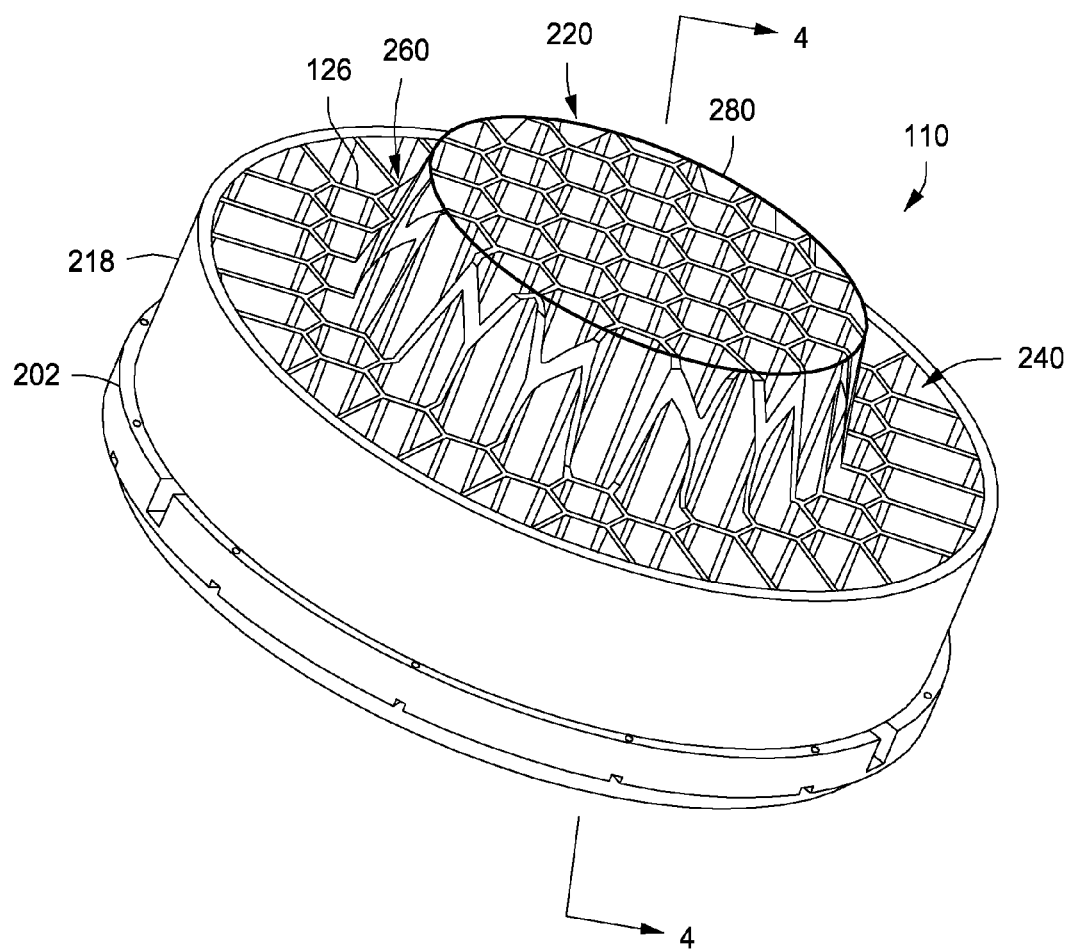
FIG. 2 depicts an isometric bottom/side view of a collimator in accordance with some embodiments of the present disclosure.

FIG. 2 is an isometric view of the collimator 110 in accordance with some embodiments of the present disclosure. FIG. 3 is a top plan view of a collimator 110 which may be disposed in the processing chamber 100 of FIG. 1. In some embodiments, the collimator 110 has a generally honeycomb structure having walls 126 separating apertures 128 in a close-packed arrangement. An aspect ratio of the apertures 128 may be defined as the depth of the aperture 128 (equal to the length of the collimator at a specific location) divided by the width 129 of the aperture 128. In some embodiments, the thickness of the walls 126 is between about 0.06 inches and about 0.18 inches. In some embodiments, the thickness of the walls 126 is between about 0.12 inches and about 0.15 inches. In some embodiments, a circle 305 circumscribing each of the apertures 128 may have a diameter of 1.5 inches. In some embodiments, the collimator 110 is comprised of a material selected from aluminum, copper, and stainless steel.

The honeycomb structure of the collimator 110 may serve as an integrated flux optimizer 310 to optimize the flow path, ion fraction, and ion trajectory behavior of ions passing through the collimator 110. In some embodiments, the walls 126 adjacent to a shield portion 202 have a chamfer 350 and a radius. The shield portion 202 of the collimator 110 may assist in the installation of the collimator 110 in the processing chamber 100.

In some embodiments, the collimator 110 may be machined from a single mass of aluminum. The collimator 110 may optionally be coated or anodized. Alternatively, the collimator 110 may be made from other materials compatible with the processing environment, and may also be comprised of one or more sections. Alternatively, the shield portion 202 and the integrated flux optimizer 310 are formed as separate pieces and coupled together using suitable attachment means, such as welding. In some embodiments, the walls 126 of the collimator 110 may be textured (e.g., bead blasted) to improve adhesion of high stress films (e.g., copper alloys) to the walls 126.

In some embodiments, the collimator 110 may be electrically biased in bipolar mode so as to control direction of the ions passing through the collimator 110. For example, a controllable direct current (DC) or AC collimator power source 390 may be coupled to the collimator 110 to provide an alternating pulsed positive or negative voltage to the collimator 110 so as to bias the collimator 110. In some embodiments, the power source 390 is a DC power source.

The collimator 110 functions as a filter to trap ions and neutrals emitted from the material from the target 142 at angles exceeding a predetermined angle, near normal relative to the substrate 154. The apertures 128 of the collimator 118 may have an aspect ratio change across the width of the collimator 110 to allow a different percentage of ions emitted from a center or a peripheral region of the material from the target 142 to pass through the collimator 110. As a result, both the number of ions and the angle of arrival of ions deposited onto peripheral regions and center regions of the substrate 154 are adjusted and controlled. Therefore, material may be more uniformly sputter deposited across the surface of the substrate 154. Additionally, material may be more uniformly deposited on the bottom and sidewalls of high aspect ratio features, particularly high aspect ratio vias and trenches located near the periphery of the substrate 154.

FIG. 4 is cross-sectional view of the collimator 110 shown in FIG. 2. The collimator 110 includes a body 218 having central region 220 having a first plurality of apertures with a high aspect ratio, such as from about 2.5:1 to about 3.3:1. In some embodiments, the first plurality of apertures in the central region have an aspect ratio of about 3.3:1. The aspect ratio of a second plurality of apertures of the collimator 110 decreases in a peripheral region 240. In some embodiments the second plurality of apertures in the peripheral region 240 have an aspect ratio of about 1:1. A higher aspect ratio allows for more apertures in the central region 220 of the collimator 110. In some embodiments, for example, the central region 220 includes 61 apertures.

In some embodiments, the radial aperture decrease of the collimator 110 is accomplished by providing a transitional region 260 disposed between the central region 220 and the peripheral region 240. The third plurality of apertures are cut along a predetermined angle so the transitional region 260 forms a conical shape surrounding the first plurality of apertures. In some embodiments, the predetermined angle may be between 15° and 45°. The transitional region advantageously provides a circular profile 280 of apertures in central region 220, which overcomes the six-point deposition near an edge of the substrate 154 due to shadowing caused by corners of a conventional hexagonal collimator.

Upper portions of the walls 126 of the apertures 128 have a chamfer 406 to decrease a rate at which the apertures 128 are clogged by sputtered material. The chamfer 406 extends a predetermined distance 402 into the aperture 128 and is formed at a predetermined angle 404. In some embodiments, the predetermined distance 402 is between about 0.15 inches to about 1 inch and the predetermined angle is between about 2.5° and about 15°. In some embodiments, the predetermined distance 402 and the predetermined angle 404 are about 0.15 inches and 15°, respectively. In some embodiments, the predetermined distance 402 and the predetermined angle 404 are about 1 inch and 2.5°, respectively.

Thus, embodiments of a cooled process tool adapter and process chambers using same have been disclosed herein. The cooled process tool adapter advantageously facilitates supporting a process tool in a process chamber while removing heat from the process tool generated during use.

While the foregoing is directed to embodiments of the present disclosure, other and further embodiments of the disclosure may be devised without departing from the basic scope thereof.

The invention claimed is:

1. A collimator for use in a substrate processing chamber, comprising:
 a body having a central region, a peripheral region, and a transitional region disposed between the central and peripheral regions;
 a first plurality of apertures in the central region having a first aspect ratio;
 a second plurality of apertures in the peripheral region having a second aspect ratio less than the first aspect ratio; and
 a third plurality of apertures in the transitional region, wherein the third plurality of apertures are cut so the transitional region forms a conical shape surrounding the central region,
 wherein the central region has a circular edge formed by the transitional region.

2. The collimator of claim 1, wherein the first plurality of apertures, the second plurality of apertures, and the third plurality of apertures are textured.

3. The collimator of claim 1, wherein the third plurality of apertures are cut at a predetermined angle of 15 to 45 degrees.

4. The collimator of claim 1, wherein the first plurality of apertures includes 61 apertures.

5. The collimator of claim 1, wherein upper portions of the first plurality of apertures, the second plurality of apertures, and the third plurality of apertures include a chamfer.

6. The collimator of claim 5, wherein the chamfer is about 2.5° and has a length of about 1 inch.

7. The collimator of claim 5, wherein the chamfer is about 15° and has a length of about 0.15 inches.

8. The collimator of claim 1, wherein an aspect ratio of the first plurality of apertures is 3.3:1.

9. The collimator of claim 1, wherein each of the first plurality of apertures, the second plurality of apertures, and the third plurality of apertures is hexagonal.

10. The collimator of claim 1, wherein a circle circumscribing each of the first plurality of apertures has a diameter of about 1.5 inches.

11. A collimator for use in a substrate processing chamber, comprising:
 a body having a central region, a peripheral region, and a transitional region disposed between the central and peripheral regions;
 a first plurality of apertures in the central region having a first aspect ratio;
 a second plurality of apertures in the peripheral region having a second aspect ratio less than the first aspect ratio; and
 a third plurality of apertures in the transitional region, wherein the third plurality of apertures are cut so the transitional region forms a conical shape surrounding the central region,
 wherein the first plurality of apertures, the second plurality of apertures, and the third plurality of apertures are textured,
 wherein upper portions of the first plurality of apertures, the second plurality of apertures, and the third plurality of apertures include a chamfer, and
 wherein the central region has a circular edge formed by the transitional region.

12. The collimator of claim 11, wherein the third plurality of apertures are cut at a predetermined angle of 15 to 45 degrees.

13. The collimator of claim 11, wherein the first plurality of apertures includes 61 apertures.

14. The collimator of claim 11, wherein the chamfer is about 2.5° and has a length of about 1 inch.

15. The collimator of claim 11, wherein the chamfer is about 15° and has a length of about 0.15 inches.

16. The collimator of claim 11, wherein an aspect ratio of the first plurality of apertures is 3.3:1.

17. The collimator of claim 11, wherein each of the first plurality of apertures, the second plurality of apertures, and the third plurality of apertures is hexagonal.

18. The collimator of claim 11, wherein a circle circumscribing each of the first plurality of apertures has a diameter of about 1.5 inches.

19. A substrate processing chamber, comprising:
 a chamber body defining an inner volume;
 a sputtering target disposed in an upper portion of the inner volume;
 a substrate support disposed below the sputtering target; and
 a collimator disposed in the inner volume between the sputtering target and the substrate support, wherein the collimator comprises:
  a body having a central region, a peripheral region, and a transitional region disposed between the central and peripheral regions;
  a first plurality of apertures in the central region having a first aspect ratio;
  a second plurality of apertures in the peripheral region having a second aspect ratio less than the first aspect ratio; and
  a third plurality of apertures in the transitional region, wherein the third plurality of apertures are cut so the transitional region forms a conical shape surrounding the central region,
  wherein the central region has a circular edge formed by the transitional region.

20. The substrate processing chamber of claim 19, wherein an aspect ratio of the first plurality of apertures is 3.3:1.

* * * * *